(12) United States Patent
Kalatzis et al.

(10) Patent No.: US 11,085,959 B2
(45) Date of Patent: Aug. 10, 2021

(54) SYSTEM FOR TESTING WIRELESS COMMUNICATION EQUIPMENT EMPLOYING ANTENNAS

(71) Applicant: AEROFLEX LIMITED, Stevenage Hertfordshire (GB)

(72) Inventors: Charalampos Kalatzis, Lower Stondon (GB); Adrian Jones, Letchworth (GB)

(73) Assignee: VIAVI SOLUTIONS INC., San Jose, CA (US)

( * ) Notice: Subject to any disclaimer, the term of this patent is extended or adjusted under 35 U.S.C. 154(b) by 26 days.

(21) Appl. No.: 16/480,906

(22) PCT Filed: Nov. 10, 2017

(86) PCT No.: PCT/GB2017/053388
§ 371 (c)(1),
(2) Date: Jul. 25, 2019

(87) PCT Pub. No.: WO2018/138465
PCT Pub. Date: Aug. 2, 2018

(65) Prior Publication Data
US 2020/0217879 A1 Jul. 9, 2020

(30) Foreign Application Priority Data
Jan. 25, 2017 (GB) .................................. 1701244

(51) Int. Cl.
*G01R 29/10* (2006.01)
*G01R 29/08* (2006.01)
*H04B 17/12* (2015.01)
*H04B 7/0404* (2017.01)
*H04B 7/06* (2006.01)

(52) U.S. Cl.
CPC ......... *G01R 29/10* (2013.01); *G01R 29/0814* (2013.01); *H04B 7/0404* (2013.01); *H04B 7/0617* (2013.01); *H04B 17/12* (2015.01)

(58) Field of Classification Search
None
See application file for complete search history.

(56) References Cited

U.S. PATENT DOCUMENTS

| | | |
|---|---|---|
| 5,606,328 A | 2/1997 | Comeau |
| 6,885,348 B1 | 4/2005 | Ryken |
| (Continued) | | |

FOREIGN PATENT DOCUMENTS

| | | |
|---|---|---|
| WO | 2009/079174 A1 | 6/2009 |
| WO | WO-2015/094177 | 6/2015 |

OTHER PUBLICATIONS

International Search Report and Written Opinion dated Jan. 31, 2018, PCT Patent Application No. PCT/GB2017/053388, filed Nov. 10, 2017, European Patent Office.

*Primary Examiner* — Anh Q Tran
(74) *Attorney, Agent, or Firm* — Mannava & Kang, P.C.

(57) ABSTRACT

A system for testing wireless communication equipment which includes a beamforming antenna, the system comprising: a probe for coupling an antenna element of the beamforming antenna of the wireless communication equipment to be tested to a test and measurement unit; and a lid configured to cover the beamforming antenna, wherein the lid is provided with a port for receiving the probe, such that the probe couples to the antenna element.

20 Claims, 2 Drawing Sheets

(56) References Cited

U.S. PATENT DOCUMENTS

| | | | |
|---|---|---|---|
| 8,013,622 B1 | 9/2011 | Wang et al. | |
| 9,705,611 B1* | 7/2017 | West | H04B 17/21 |
| 9,838,076 B2* | 12/2017 | Lam | H04B 3/52 |
| 2006/0132115 A1 | 6/2006 | Maurice | |
| 2009/0153158 A1* | 6/2009 | Dunn | G01R 31/2822 |
| | | | 324/762.01 |
| 2012/0262188 A1* | 10/2012 | Nickel | H04B 17/20 |
| | | | 324/629 |
| 2015/0188647 A1* | 7/2015 | Wang | H01Q 3/267 |
| | | | 455/67.12 |
| 2016/0043778 A1 | 2/2016 | Sikiria et al. | |

* cited by examiner

SYSTEM FOR TESTING WIRELESS COMMUNICATION EQUIPMENT EMPLOYING ANTENNAS

PRIORITY

The present application is a national stage filing under 35 U.S.C. § 371 of PCT application number PCT/GB2017/053388, having an international filing date of Nov. 10, 2017, which claims priority to GB Application Serial Number 1701244.4, filed Jan. 25, 2017, the disclosures of which are hereby incorporated by reference in their entireties.

TECHNICAL FIELD

The present application relates to a system and method for testing wireless communication equipment that incorporates beamforming antennas.

BACKGROUND TO THE INVENTION

Many modern communications devices such as mobile telephones and the network base stations that serve them employ antennas comprising an array containing multiple individual antenna elements. By feeding the antenna elements with appropriate signals, these antennas can be made to transmit or receive electromagnetic waves in particular directions. Such antennas are commonly referred to as "beamforming antennas". Various different types of beamforming antennas are known, including analogue beamforming antennas, analogue dual-polarisation beamforming antennas, hybrid beamforming antennas and digital beamforming antennas (or massive MIMO antennas).

As wireless communication equipment that employs beamforming antennas is highly complex, such equipment is typically subject to rigorous testing both during development and during manufacture. One current testing method, which is sometimes referred to "as over the air (OTA) far-field testing", involves placing test and measurement equipment having one or more antennas capable of receiving (or transmitting) signals that are transmitted (or received) by the antenna(s) of the wireless communication equipment under test, such as a transmitter or receiver, in an anechoic chamber at a predetermined distance (typically several metres) from the wireless communication equipment under test. The anechoic chamber is an electromagnetically shielded and non-reflective room which provides highly controllable propagation conditions between the antenna of the wireless communication equipment under test and the antenna of the test and measurement equipment. A test signal is then transmitted by the antenna of the wireless communication equipment under test, and the transmitted test signal is detected by the antenna of the test and measurement equipment. Similarly, a test signal can be transmitted by the antenna of the test and measurement equipment and received by the antenna of the wireless communication equipment under test.

This approach has a number of disadvantages. The relative location of the antenna(s) of the test and measurement equipment and the antenna(s) of the wireless communication equipment under test within the anechoic chamber will affect the measured signal strength of the detected test signal, since the beam direction of the signal transmitted by the antenna of the wireless communication equipment under test will not necessarily align with the direction of the antenna of the test and measurement equipment. If the position of the antenna of the test and measurement equipment within the anechoic chamber or the orientation of the antenna of the wireless communication equipment under test is not changed to account for differences in the direction of the beams transmitted by the antenna of the wireless communication equipment under test, severe nulls will occur in the received signal, leading to variations of 30 dB or more in the received signal strength, making the test unreliable. The same is true if the reception beam of the antenna of the wireless communication equipment under test is not aligned with the antenna direction of the antenna of the test and measurement equipment.

Further, this approach is costly, and is not space-efficient, as it requires an entire anechoic chamber for testing a limited number of pieces of wireless communication equipment, and is thus unsuitable for testing required during manufacture of such wireless communication equipment.

Accordingly, a need exists for a cost-effective, fast, and reliable method for testing wireless communication equipment that employs beamforming antennas.

SUMMARY OF INVENTION

According to a first aspect of the invention there is provided a system for testing wireless communication equipment which includes a beamforming antenna, the system comprising: a probe for coupling an antenna element of the beamforming antenna of the wireless communication equipment to be tested to a test and measurement unit; and a lid configured to cover the beamforming antenna of the wireless communication equipment to be tested, wherein the lid is provided with a port for receiving the probe, such that, when received in the port, the probe couples to the antenna element.

The system of the present invention provides a compact, cost-effective and rapidly deployed system for testing wireless communication equipment incorporating one or more beamforming antennas which can be employed in both production test applications and development applications The lid is preferably of a material that is opaque to electromagnetic radiation. Further, the lid is preferably provided with a material which absorbs electromagnetic radiation.

The port may be positioned such that, when the lid is in position on the antenna and the probe is received in the port, the probe aligns with the antenna element.

The lid may be configured to engage with a mechanical feature of the beamforming antenna. For example, the lid may be configured to engage with a mounting flange of the beamforming antenna that would otherwise be used to mount a radome on the antenna.

A first end of the probe may be in physical contact with the antenna element.

Alternatively, the first end of the probe may not be in physical contact with the antenna element, but may be positioned in close proximity to the antenna element, such that the probe couples to the antenna element in or close to a near field reactive region of the antenna element.

A distance between the first end of the probe and the antenna element may be equal to or less than $$\frac{\lambda}{2\pi},$$

where λ is the wavelength of a test signal to be transmitted or received by the antenna element.

The probe may comprises one or more of: a dielectrically loaded waveguide; an air filled waveguide; a loop antenna; a dipole antenna; a monopole antenna; a coaxial cable and a coaxial connector.

The system may comprise a plurality of probes and the lid may be provided with a plurality of ports for receiving the plurality of probes, such that, when the plurality of probes are received in the plurality of ports, each of the plurality of probes couples to a different antenna element of the antenna of the wireless communication equipment to be tested.

The antenna may be a dual polarising antenna and the probe may be a dual polarising probe.

According to a second aspect of the invention there is provided a method for testing wireless communication equipment which includes a beamforming antenna, the method comprising: covering the beamforming antenna with a lid, the lid being provided with a port for receiving a probe; receiving a probe in the port of the lid; coupling the probe at a first end thereof to an antenna element of the beamforming antenna; coupling or connecting the probe at a second end thereof to test and measurement equipment; transmitting or receiving, by the antenna element, a test signal; and detecting or generating, at the test and measurement equipment, the test signal.

The lid is preferably of a material that is opaque to electromagnetic radiation. Further, the lid is preferably provided with a material which absorbs electromagnetic radiation.

The port may be positioned such that, when the lid is in position on the antenna and the probe is received in the port, the probe aligns with the antenna element.

The lid may be configured to engage with mechanical feature of the beamforming antenna. For example, the lid may be configured to engage with a mounting flange of the beamforming antenna that would otherwise be used to mount a radome on the antenna.

The first end of the probe may be in physical contact with the antenna element.

Alternatively, the first end of the probe may not be in physical contact with the antenna element, but may be positioned in close proximity to the antenna element, such that the probe couples to the antenna element in or close to a near field reactive region of the antenna element.

A distance between the first end of the probe and the antenna element may be equal to or less than $\lambda/2\pi$, where $\lambda$ is the wavelength of a test signal to be transmitted or received by the antenna element.

The probe may comprise one or more of: a dielectrically loaded waveguide; an air filled waveguide; a loop antenna; a dipole antenna; a monopole antenna; a coaxial cable and a coaxial connector.

The lid may be provided with a plurality of ports for receiving a plurality of probes, and the method may further comprise receiving a plurality of probes in the plurality of ports, such that, when the plurality of probes are received in the plurality of ports, each of the plurality of probes couples to a different antenna element of the antenna of the wireless communication equipment to be tested.

The antenna may be a dual polarising antenna and the probe may be a dual polarising probe.

BRIEF DESCRIPTION OF THE DRAWINGS

Embodiments of the invention will now be described, strictly by way of example only, with reference to the drawings, of which.

DESCRIPTION OF THE EMBODIMENTS

Figure 1:
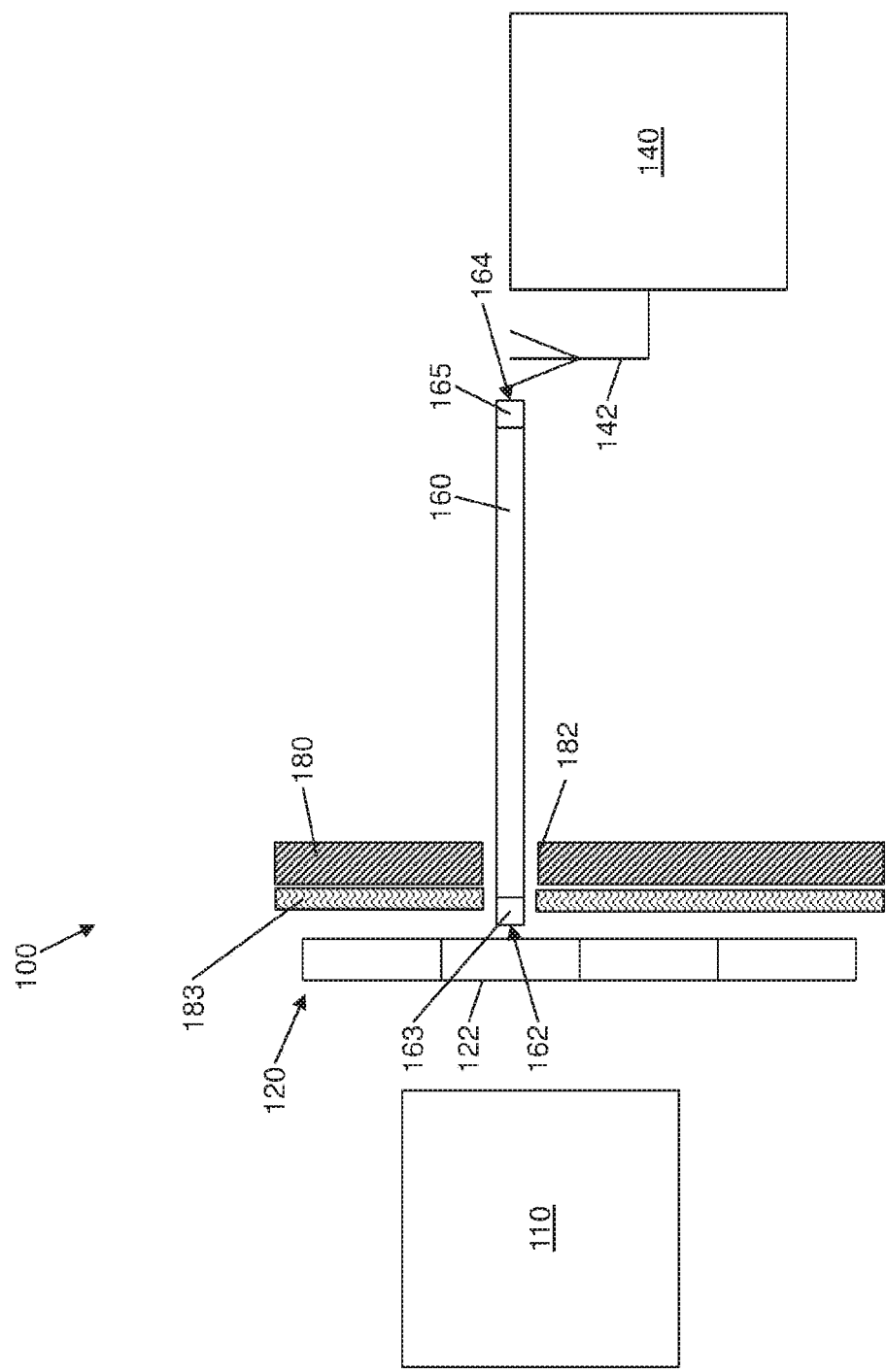
FIG. 1 is a schematic representation of a system for testing an antenna.

Referring first to FIG. 1, a system for testing wireless communication equipment that employs a beamforming antenna is shown generally at 100.

The wireless communication equipment under test, shown generally at 110 in FIG. 1, includes (is connected to or integrated with) an antenna 120, which comprises an array having a plurality (in this example 4) of individual antenna elements 122 which can be controlled using appropriate control signals to cause the antenna 120 to transmit a directional electromagnetic wave. The wireless communication equipment under test 110 may be configured to transmit a wave in the microwave wave band or in the millimetre wave band, for example.

The purpose of the system described here is to detect a test signal transmitted by a single antenna element 122 of the antenna 120 of the wireless communication equipment under test 110, rather than to detect or measure the signal transmitted by the antenna 120 as a whole.

To this end, the system includes test and measurement equipment 140 having one or more antennas or antenna connectors or interfaces 142 through which a test signal transmitted by an antenna element 122 of the antenna 120 of the wireless communication equipment under test 110 can be received. The antenna 120 of the wireless communication equipment under test 110 and the antenna, antenna connector or interface 142 of the test and measurement equipment 140 are preferably bidirectional, such that they are able to transmit or receive test signals. A test signal transmitted by the antenna 120 of the wireless communication equipment under test 110 can be received by the antenna 142 of the test and measurement equipment. Similarly, a test signal can be transmitted by the antenna 142 of the test and measurement equipment 140 and received by the antenna 120 of the wireless communication equipment under test 110.

A probe 160 is provided for coupling the antenna 142 (or antenna connector or interface) of the test and measurement equipment 140 to a desired antenna element 122 of the antenna 120 of the wireless communication equipment under test 110.

A lid 180 is also provided, to cover and shield the plurality of antenna elements 122 of the antenna 120 of the wireless communication equipment under test 110. The lid 180 is configured to engage with the antenna 120 so as to cover all of the antenna elements 122. For example, the lid 180 may be configured to engage with mechanical means of the antenna 120 such as a flange of the antenna 120 which would normally be used to engage a radome to the antenna 120.

The lid 180 is provided with a port 182 which is configured to receive the probe 160. When the lid 180 is correctly engaged with the antenna 120 of the wireless communication equipment under test 110, the port 182 is positioned such that a first end 162 of the probe 160 is aligned with the antenna element 122 to be tested. Thus, the location of the port 182 is chosen such that the probe 160, when received in the port 182, couples most closely to only the desired one of the antenna elements 122 of the beamforming antenna 120.

Unlike in prior art test solutions, the system 100 described here does not measure the far field radiation of the antenna 120 of the wireless communication equipment under test 110. Instead, the system 100 is for receiving, at the test and measurement equipment 140, a test signal transmitted by a single one of the antenna elements 122.

In order to achieve this, the first end 162 of the probe 160 positioned so as to couple with the desired antenna element 122. The probe 160 may couple with the desired antenna element 122 in or close to the near field reactive region of the desired antenna element 122.

For example, the first end 162 of the probe 160 may be in physical contact with the antenna element 122.

Alternatively, the first end 162 of the probe 160 may not be in physical contact with the antenna element 122, but may instead be positioned in sufficiently close proximity to achieve the required coupling, for example in or close to the near field reactive region of the desired antenna element 122.

The distance between the first end 162 of the probe 160 and the antenna element 122 may be equal to or less than $$\frac{\lambda}{2\pi},$$

where $\lambda$ is the wavelength of the signal. Distances in this range have been found to be particularly suitable, though simulations suggest that suitable coupling may be achieved at distances up to $\lambda$. If larger distances are used it becomes more difficult to mitigate cross-coupling of the probe 160 to antenna elements of the beamforming antenna 120 of the wireless communication equipment under test 110 other than the desired antenna element 122.

Because of the coupling of the probe 160 to a single one of the antenna elements 122 of the beamforming antenna 120 of the wireless communication equipment under test 110, the coupled signal level is relatively insensitive to the direction of the beam transmitted (or received) by the antenna element 122. This gives rise to significant advantages over prior art systems that rely on far-field coupling, in that the time-consuming process of precisely aligning the antenna element 122 with the beam direction is not required.

A second end 164 of the probe 160 couples or connects with the antenna or antenna connector or interface 142 of the test and measurement equipment 140 so as to transmit the test signal from the desired antenna element 122 to the test and measurement equipment 140. The second end 164 of the probe may couple to or be in physical contact with the antenna 142 of the test and measurement equipment 140, or may be physically connected to an antenna connector or interface 142 of the test and measurement equipment 140 to achieve the required coupling.

The lid 180 is made of a material such as a metal that is opaque to electromagnetic radiation. The lid may be filled, covered or otherwise provided with a material 183 which absorbs electromagnetic radiation. The lid thus shields the antenna elements 122 from external sources of electromagnetic radiation, and absorbs radiation emitted by the antenna 120 except the antenna element 122. Thus, the lid 180 ensures that only signals transmitted by the single desired antenna element 122 to which the first end 162 of the probe 160 is (most strongly) coupled are transmitted to the antenna 142 (or antenna connector) of the test and measurement equipment 140, by absorbing electromagnetic radiation from other antenna elements of the antenna under test 120, and shielding the first end 162 of the probe 160 from external electromagnetic radiation. The lid 180 therefore provides screening of the system 100 at a vastly reduced cost in comparison to prior art systems that require an anechoic chamber, whilst also providing a non-reflective channel for the antenna 120 of the wireless communication equipment under test 110.

The lid 180 may be of any shape that is suitable for accurate and effective positioning of the probe 160. For example, the lid 180 may be positioned outside a radome of the beamforming antenna 120 of the wireless communication equipment under test 110, and may conform to the shape of the radome. Alternatively, the lid 180 may be fitted in place of the radome. If the lid 180 is fitted in place of the radome, it may use the same mechanical mounting as the radome, for example attaching to a flange or other mechanical feature of the antenna 120 to which the radome would otherwise be attached with screws or other fasteners. Using the mechanical mounting or other features of the antenna 120 to which a radome would otherwise be attached for mounting the lid 180, helps to achieve precise alignment of the lid 180 with the antenna 120.

The lid 180 and probe 160 may be specifically designed for a particular beamforming antenna 120. Alternatively, the lid 180 may be designed for general use on a range of different beamforming antennas. A lid 180 designed for general use may have a curved or hemispherical shape to allow large numbers of probes to be fitted. A lid 180 designed for general use may further include mechanical adjustment means to allow the position of the probe(s) 160, when received in the port(s) to be adjusted to align precisely with the antenna elements 122 of the beamforming antenna 120.

The probe 160 is provided, at or towards its first end 162, with probe coupler means 163 for coupling the probe 160 to the desired antenna element 122 of the antenna 120 of the wireless communication equipment under test 110. A connection or coupler 165 is provided at or towards the second end 164 of the probe 160, for feeding the coupled energy to the test and measurement equipment 140 via the antenna or antenna connector or interface 142.

The probe coupler means 163 may be of any construction or configuration that permits coupling of the antenna element 122 to the first end 162 of the probe 160, for example coupling in or close to the near field reactive region of the desired antenna element 122.

For example, the probe coupler means 163 may be a dielectrically loaded waveguide aperture, or an air filled waveguide aperture. Waveguides are particularly suited to use as the probe coupler means 163 where the signal to be transmitted or received by the desired antenna element 122 of the antenna 120 of the wireless communication equipment under test 110 has a wavelength in the centimetre or millimetre range.

Alternatively, the probe coupler means 163 may be an electrically small loop antenna or an electrically short monopole or dipole. The terms "electrically small" and "electrically short" as used here mean small or short in comparison with the wavelength of the signal to be transmitted or received.

If the probe coupler means 163 is suitably insulated it may (when the probe 160 is correctly received in the port of the lid 180) be in physical contact with the desired antenna element 122 of the antenna 120 of the wireless communication equipment under test 110. In the case of a dielectrically loaded waveguide probe, this insulation may be achieved by using dielectric material protruding from the end of the waveguide.

The connection or coupler 165 may be any structure which is compatible with the probe coupler means 163. Thus, the connection or coupler 165 may be a waveguide aperture if the probe coupler means 163 is a waveguide and the body of the probe 160 is a waveguide, whereas a coaxial connector may be used if the probe coupler means 163 is not a waveguide and the body of the probe 160 is a coaxial cable.

Alternatively, instead of using a probe coupler means 163, the coaxial cable body of the probe may be physically coupled to or engaged with the relevant antenna element 122 of the beamforming antenna 120 of the wireless communication equipment under test 110 by an electrical network, for example using springs, clips or other physical connection means. The purpose of this electrical network is to provide the required impedance matching and coupling coefficient between the antenna element 122 and the test and measurement equipment 140.

The probe 160 may be adapted for operation with different types of antenna 120. For example, where the antenna 120 is a dual polarising antenna, the probe 160 may be a dual polarised probe. When using dual polarisation, the effect of imperfect isolation between the two polarisations or of misalignment between the antennas may be compensated for by the test and measurement unit 140.

As will be appreciated by those skilled in the art, the coupling between the probe 160 and the antenna 142 (or antenna connector or interface) of the test and measurement equipment 140 constitutes a transition. For example, where the probe 160 is a waveguide probe, the transition may be from waveguide to coaxial cable. However, if the probe 160 is a waveguide probe and the test and measurement equipment 140 has a waveguide interface 142, then the transition from waveguide to coaxial cable is not required; the probe 160 can interface directly with the waveguide interface 142 of the test and measurement equipment 140. Similarly, if the probe 160 uses a coaxial connector 165 and the test and measurement equipment 140 has a compatible connector no transition is required; the coaxial connector 165 of the probe 160 can connect directly to the compatible connector of the test and measurement equipment 140.

The signals transmitted and received by the test and measurement equipment 140 may be processed in order to compensate for non-ideality of the coupling between the probe 160 and the desired antenna element 122 of the beamforming antenna of the wireless communication equipment under test 110. In particular, if cross-coupling to undesired antenna elements is not too strong (i.e. there is a low condition number), the system 100 may be calibrated with known signals, and signal components arising from undesired cross-coupling may be cancelled. However, if the probe 160 is positioned sufficiently close to the desired antenna element 122 such compensation will be unnecessary.

The example illustrated in FIG. 1 uses a single probe 160 to detect a test signal from a single antenna element 122. In this arrangement a single beam can be detected or excited at one time, frequency or polarisation independent of the beam direction.

It will be appreciated that the same approach can be used to detect, simultaneously, test signals transmitted by multiple antenna elements of a beamforming antenna. For example, where the antenna is a hybrid or digital beamforming antenna in which multiple antenna elements concurrently transmit multiple streams, multiple probes may be aligned with the relevant antenna elements through respective ports in the lid in order to couple the relevant antenna elements to the antenna(s) of the measurement unit. Thus, where multiple beams are to be detected at the same time, frequency and polarisation, multiple probes can be used to couple multiple different antenna elements of the antenna of the wireless communication equipment under test to the test and measurement equipment.

Similarly, if the beam direction of a single beam should be detected or excited by physical layer means, multiple probes should be used to couple multiple different antenna elements of the antenna of the wireless communication equipment under test to the test and measurement equipment.

The number of probes required will depend on the required test scenario. The use of multiple probes permits more complex test scenarios to be implemented than is possible using only a single probe, such as the detection and simulation of multiple beams. In an extreme case, the system could include sufficient probes to couple to all of the antenna elements 122, thereby allowing full simulation of multiple simultaneous beams. Such an arrangement would be applicable, for example, to the testing of massive (or full dimension) MIMO.

Figure 2:
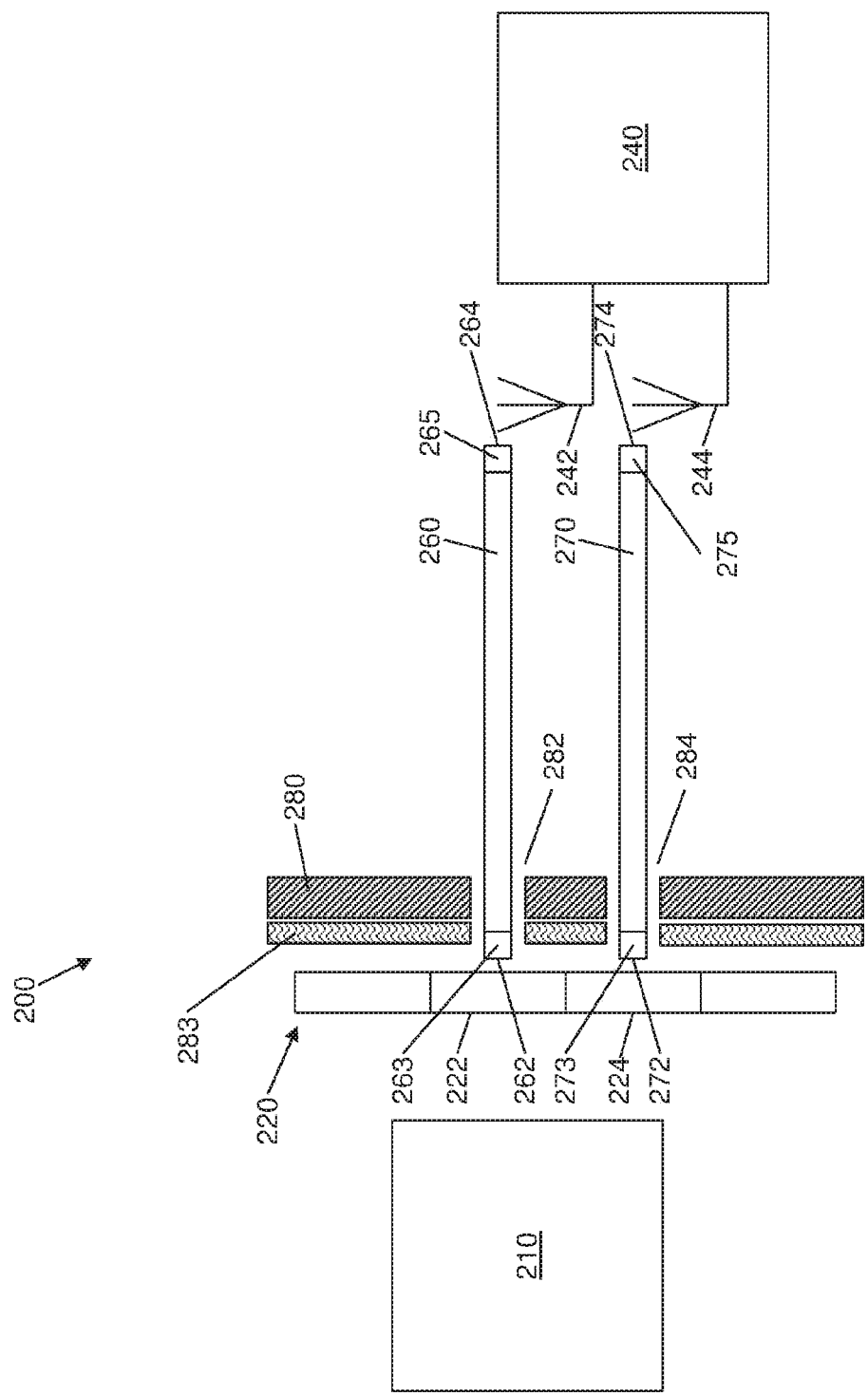
FIG. 2 is a schematic representation of an alternative system for testing an antenna.

An arrangement which employs a plurality of probes is illustrated schematically in FIG. 2, which shows a system 200 for detecting test signals transmitted by first and second antenna elements 222, 224 of a beamforming antenna 220 belonging to wireless communication equipment under test 210. It will be appreciated that while the schematic illustration of FIG. 2 shows only two probes, any number of probes may be provided in accordance with the requirements of the particular test application, with each probe being coupled to a different one of the antenna elements of the beamforming antenna 220 of the wireless communication equipment under test 210.

In the exemplary system 200 illustrated in FIG. 2, test and measurement equipment 240 has a first antenna or antenna connector or interface 242 and a second antenna or antenna connector or interface 244. A lid 280 is provided to cover the antenna elements of the antenna 220. Like the lid 180 of FIG. 1, the lid 280 is made of a material such as a metal that is opaque to electromagnetic radiation, and is filled, covered or otherwise provided with a material 283 which absorbs electromagnetic radiation. The lid thus shields the antenna elements of the antenna 220 from external sources of electromagnetic radiation, and absorbs radiation emitted by the antenna 220 except antenna elements 222, 224.

A first probe 260 passes through a first port 282 in the lid 280 and is coupled at a first end 262 (via probe coupler means 263 of the same kind as the probe coupler means 163 described above) to the first antenna element 222 in or close to the near field reactive region of the first antenna element 222. Similarly, a second probe 270 is passes through a second port 284 in the lid 280 and is coupled at a first end 272 (via probe coupler means 273 of the same kind as the probe coupler means 163 described above) to the second antenna element 224 in the near field reactive region of the second antenna element 222. A second end 264 of the first probe 260 includes a connection or coupler 265 (of the same kind as the connection or coupler 165 described above) which is coupled or connected to the first antenna 242 or antenna connector or interface of the test and measurement equipment 240, and a second end 274 of the second probe 270 includes a connection or coupler 275 (of the same kind as the connection or coupler 165 described above) which is coupled or connected to the second antenna 244 or antenna connector or interface of the test and measurement equipment 240. In this way the test and measurement equipment 240 is able to detect test signals transmitted by the first and second antenna elements 222, 224 of the antenna 220. These signals may be transmitted concurrently or in a predetermined sequence in time.

As will be understood by those skilled in the art, the test and measurement equipment 240 need not have multiple antennas. Instead, the first and second probes 260, 270 may each couple to a single antenna (or antenna connector or interface) of the test and measurement equipment 240 to detect the signals transmitted by the first and second antenna elements 222, 224 of the antenna 220.

Again, as will be apparent to those skilled in the art, the coupling between the probes 260, 270 and the antennas 242, 244 (or antenna connectors or interfaces) of the test and measurement equipment 240 constitutes a transition. For example, where the probes 260, 270 are waveguide probes, the transition may be from waveguide to coaxial cable. However, if the probes 260, 270 are waveguide probes and the test and measurement equipment 240 has waveguide interfaces 242, 244, then the transition from waveguide to coaxial cable is not required; the probes 260, 270 can interface directly with the waveguide interfaces 242, 244 of the test and measurement equipment 240. Similarly, if the probes 260, 270 use coaxial connectors 265, 275 and the test and measurement equipment 240 has a compatible connector no transition is required; the coaxial connectors 265, 275 of the probes 260, 270 can connect directly to the compatible connector of the test and measurement equipment 240.

It will be appreciated by those skilled in the art that a great many different types or pieces of test and measurement equipment 140, 240 are suitable for detecting the test signals transmitted by the antenna elements 122, 222, 224, and thus the invention is not limited to any particular test and measurement equipment 140, 240.

Instead, it is envisaged that one or more lids 180, 280 and probes 160, 260, 270 that are configured as appropriate for the antennas 120, 220 of the wireless communication equipment 110, 210 to be tested will be provided, with the probes having at their second ends 164, 264, 274 appropriate connectors, couplers, transitions or terminations to permit the probes 160, 260, 270 to couple to different test and measurement equipment 140, 240.

As will be appreciated from the discussion above, the system 100, 200 described here provides significant benefits over existing test solutions. For example, the system described here obviates the need for an anechoic chamber, since the lid fulfils the electromagnetic shielding and absorption function of the anechoic chamber, and so can be employed cost effectively in both production test applications and development applications. Further, the arrangement described here reduces the time taken to perform antenna tests, as the time-consuming steps of positioning and repositioning the wireless communication equipment under test and/or the antenna of the test and measurement equipment in order to ensure effective detection of transmitted test signals are not required, since the antenna of the wireless communication equipment being tested is directly coupled to the test and measurement equipment.

The invention claimed is:

1. A system for testing wireless communication equipment, the system comprising:
   a probe for coupling an antenna element of a beamforming antenna of wireless communication equipment to be tested to a test and measurement unit, wherein the wireless communication equipment is to transmit a wave in the microwave band or in the millimeter wave band; and
   a lid to cover the beamforming antenna of the wireless communication equipment,
   wherein the lid is provided to facilitate the probe to align and couple to the antenna element using a probe coupling element.

2. The system of claim 1, wherein the lid is of a material that is opaque to electromagnetic radiation, and wherein the lid is provided with a material which absorbs electromagnetic radiation.

3. The system of claim 1, wherein the port is positioned such that, when the lid is in position on the antenna and the probe is received in the port, the probe aligns with the antenna element.

4. The system of claim 1, wherein the lid is to engage with a mechanical feature of the beamforming antenna.

5. The system of claim 1, wherein a first end of the probe is in physical contact with the antenna element.

6. The system of claim 1, wherein a first end of the probe is in close proximity to the antenna element, such that the probe couples to the antenna element in or close to a near field reactive region of the antenna element.

7. The system of claim 6, wherein a distance between the first end of the probe and the antenna element is equal to or less than $\lambda/2\pi$, where $\lambda$ represents a wavelength of a test signal to be transmitted or received by the antenna element.

8. The system of claim 1, wherein the probe comprises at least one of:
   a dielectrically loaded waveguide;
   an air filled waveguide;
   a loop antenna;
   a dipole antenna;
   a monopole antenna;
   a coaxial cable; and
   a coaxial connector.

9. The system of claim 1, wherein the system comprises a plurality of probes, and wherein the lid is provided with a plurality of ports for receiving the plurality of probes, such that, when the plurality of probes is received in the plurality of ports, each of the plurality of probes couples to a different antenna element of the antenna of the wireless communication equipment to be tested.

10. The system of claim 1, wherein the antenna is a dual polarizing antenna and the probe is a dual polarizing probe.

11. A method for testing wireless communication equipment, the method comprising:
   covering a beamforming antenna of wireless communications equipment with a lid, the lid being provided with a port for receiving a probe, wherein the wireless communication equipment is to transmit a wave in the microwave band or in the millimeter wave band;
   receiving a probe in the port of the lid;
   communicatively coupling the probe at a first end thereof to an antenna element of the beamforming antenna using a probe coupling element;
   communicatively coupling the probe at a second end thereof to test and measurement equipment;
   transmitting or receiving, by the antenna element, a test signal; and
   detecting or generating, at the test and measurement equipment, the test signal.

12. The method of claim 11, wherein the lid is of a material that is opaque to electromagnetic radiation, and wherein the lid is provided with a material which absorbs electromagnetic radiation.

13. The method of claim 11, wherein the port is positioned such that, when the lid is in position on the antenna and the probe is received in the port, the probe aligns with the antenna element.

14. The method of claim 11, wherein the lid is to engage with mechanical feature of the beamforming antenna.

15. The method of claim 11, wherein the first end of the probe is in physical contact with the antenna element.

16. The method of claim 11, wherein the first end of the probe is in close proximity to the antenna element, such that the probe couples to the antenna element in or close to a near field reactive region of the antenna element.

17. The method of claim 16, wherein a distance between the first end of the probe and the antenna element is equal to or less than $\lambda/2\pi$, where $\lambda$ represents a wavelength of a test signal to be transmitted or received by the antenna element.

18. The method of claim 11, wherein the probe comprises at least one of:
   a dielectrically loaded waveguide;
   an air filled waveguide;
   a loop antenna;
   a dipole antenna;
   a monopole antenna;
   a coaxial cable; and
   a coaxial connector.

19. The method of claim 11, wherein the lid is provided with a plurality of ports for receiving a plurality of probes, and wherein the method further comprises receiving a plurality of probes in the plurality of ports, such that, when the plurality of probes is received in the plurality of ports, each of the plurality of probes couples to a different antenna element of the antenna of the wireless communication equipment to be tested.

20. The method of claim 11, wherein the antenna is a dual polarizing antenna and the probe is a dual polarizing probe.

* * * * *